(12) United States Patent
Yu et al.

(10) Patent No.: US 7,491,584 B2
(45) Date of Patent: Feb. 17, 2009

(54) ESD PROTECTION DEVICE IN HIGH VOLTAGE AND MANUFACTURING METHOD FOR THE SAME

(75) Inventors: Ding-Jeng Yu, Hsin Chu (TW); Tao Cheng, Hsin Chu (TW); Chao-Chih Chiu, Hsin Chu Hsien (TW)

(73) Assignee: Mediatek Inc., Hsin-Chu, Hsien (TW)

( * ) Notice: Subject to any disclaimer, the term of this patent is extended or adjusted under 35 U.S.C. 154(b) by 321 days.

(21) Appl. No.: 11/186,857

(22) Filed: Jul. 22, 2005

(65) Prior Publication Data

US 2007/0020818 A1    Jan. 25, 2007

(51) Int. Cl.
*H01L 21/82* (2006.01)
*H01L 21/8222* (2006.01)
*H01L 21/8228* (2006.01)

(52) U.S. Cl. .................... 438/128; 438/133; 438/237; 438/328

(58) Field of Classification Search ................ 438/128, 438/200, 275, 133, 237, 328
See application file for complete search history.

(56) References Cited

U.S. PATENT DOCUMENTS

| 6,507,090 | B1 * | 1/2003 | Hu et al. ............. 257/586 |
| 6,542,346 | B1 | 4/2003 | Chen et al. |
| 7,023,676 | B2 * | 4/2006 | Ker et al. ............. 361/56 |
| 7,067,884 | B2 * | 6/2006 | Okushima ............. 257/355 |
| 2004/0085691 | A1 | 5/2004 | Ker et al. |

* cited by examiner

*Primary Examiner*—Michael Trinh
(74) *Attorney, Agent, or Firm*—Birch, Stewart, Kolasch & Birch, LLP

(57) ABSTRACT

Electrostatic discharge (ESD) protection device in high voltage and the relevant manufacturing method is disclosed. The mentioned ESD protection device is disposed to bridge a ground and an input connected with an inner circuit to be protected. In which, the ESD protection device for high voltage comprises at least one PNP transistor and at least one diode connected in parallel, and an ESD discharging path is formed thereby. The PNP transistor is formed with an adjacent heavily doped P-type semiconductor zone (P+), lightly doped N-type semiconductor zone (N−), and a P-type semiconductor substrate. The diode is formed with an adjacent lightly doped N-type semiconductor zone and a light doped P-type semiconductor zone.

17 Claims, 11 Drawing Sheets

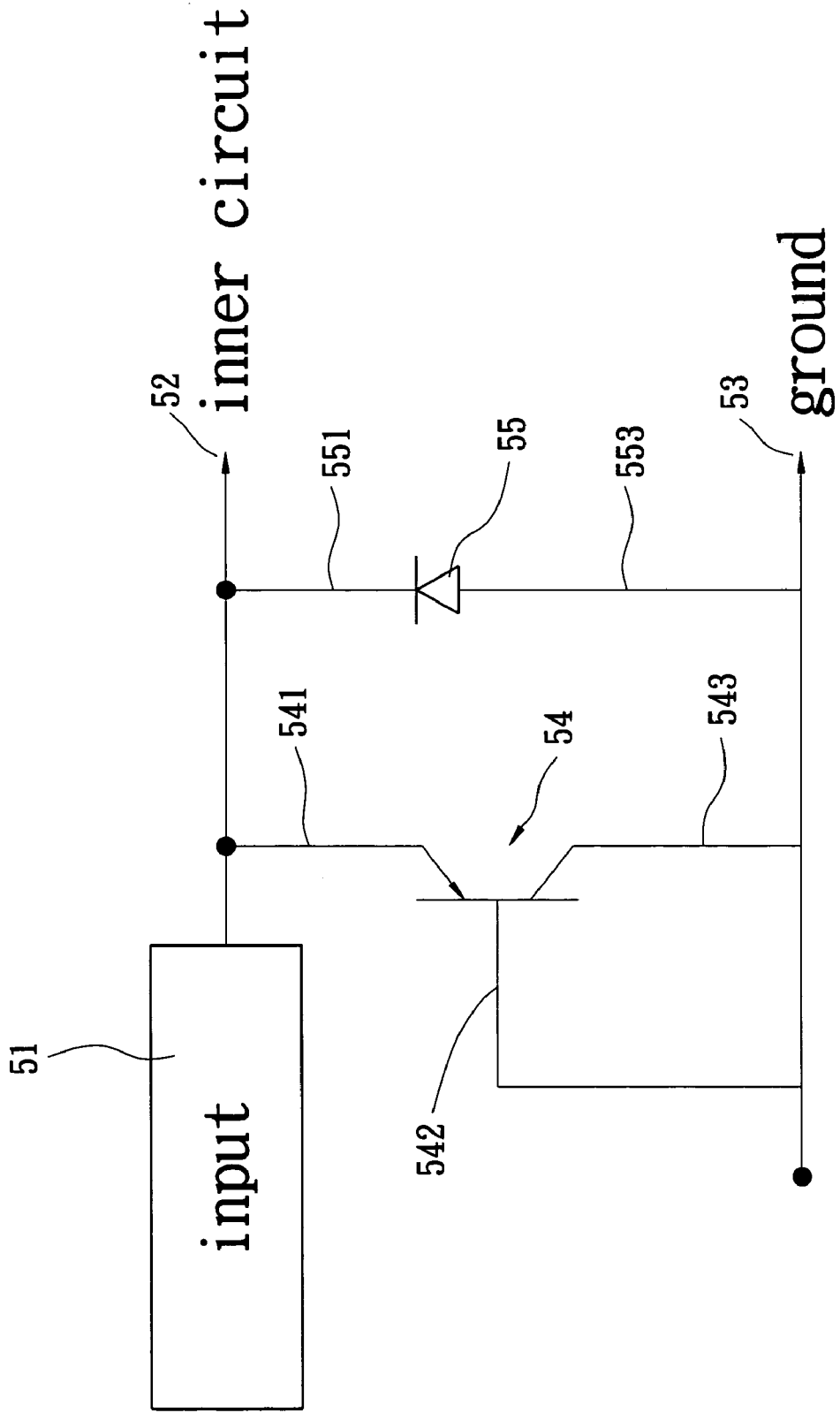

ESD PROTECTION DEVICE IN HIGH VOLTAGE AND MANUFACTURING METHOD FOR THE SAME

BACKGROUND OF THE INVENTION

The present invention relates to an ESD protection device working in high voltage and the manufacturing method, more particularly to the ESD protection circuit, which comprises at least one PNP transistor and at least one diode coupled in parallel to enhance the ESD protection capability.

Electrostatic discharge (ESD) is the major threat to destroy an electrical element due to the electrical overstress (EOS) when the electrical element is operated. The ESD event can easily break down the electrical element and cause the semiconductor elements, computer system, etc. to be permanent damage since the elements are getting tiny and subtle. After that, the relevant product will be affected and failed.

The electrostatic charges will be accumulated in human body, electrical apparatus, or any other equipment during the electrical elements or device is under manufacturing, producing, installing, testing, storing or moving process. Generally, the electrostatic discharging is incurred from the cause of human body terminal. Afterward, the electrostatic charges will be discharged and formed an ESD discharging path while the human body terminals with the objects mentioned above or any other terminal event occurs between the elements. Then the electrical elements or devices would suffer the unexpected damage.

An ESD protection circuit or protection device is incorporated to be the discharging path provider within the integrated chip (IC) or electrical circuit generally. Since the elements used in the ESD protection circuit must have low breakdown voltage therein or- faster discharging speed, the ESD protection circuit nearby should have an ESD discharging path to discharge the ESD current at an early time while the ESD event occurred in the I/O pins.

The elements used in the ESD protection circuit of the prior art includes (1) Electric resistance; (2) Diode formed with PN junction; (3) NMOS/PMOS; (4) Field-oxide device; (5) Bipolar junction transistor; (6) Silicon controlled rectifier (SCR) device (P-N-P-N structure), etc.

FIG. 1 shows the current-voltage (I-V) curve of the ESD protection element. ESD protection element is used to discharge the ESD current in a first breakdown zone 2 shown in FIG. 1. If the ESD current reaches the second breakdown zone 4, the element would incur the permanent damage. In general, an ESD protection element can tolerate a maximum .ESD current Ibd, which is the current corresponding to a second breakdown point C shown in FIG. 1. When the element goes through a first breakdown point A to the second breakdown zone 4, the ESD protection device operates in a snap breakdown zone 3. Therefore, the ESD protection device will not be damaged, and even form an ESD discharging path to ground potential.

Reference is made to FIG. 2 shown an ESD protection device of the prior art. Two clamping diodes 25, 26 are installed between an input contact 21 and an inner circuit 23, and are used to be the protection devices as the ESD event occurred. When the input contact 21 received a positive ESD pulse, whose peak is higher than VDD, diode 25 will be turned on and induce current to flow to the power supply VDD rather than to the inner circuit 23. Similarly, when the input contact 21 received a negative ESD pulse, whose peak is lower than VSS, diode 26 will be turned on and induce current to flow to the power supply VSS rather than to the inner circuit 23.

U.S. Pat. No. 6,542,346 discloses an ESD protection circuit shown in FIG. 3. The ESD protection circuit is employed to couple with an input 31 and an inner circuit 33. The ESD protection circuit comprises a voltage-sharing- circuit 35 and a silicon controlled rectifier (SCR) 37. The voltage-sharing circuit 35 is electrically coupled between the VSS and the input 31, and a reference voltage not higher than the voltage of the input 31 is generated thereby. The SCR 37 electrically couples with the input 31, ground and the voltage-sharing circuit 35, and is formed by the heavily concentration P-type and N-type semiconductor. material on a P-type semiconductor substrate. Then the voltage-sharing circuit 35 is used to turn on a NMOS switch 36 of the SCR 37 by taking the reference of the reference voltage during the ESD discharging event. Wherein the NMOS switch 36 comprises a gate to trigger the SCR 37 to release the ESD current at input 31. Lastly the SCR 37 is to provide an ESD discharging path to protect the inner circuit 33.

A PNP transistor is to be the ESD protection element as the U.S. Pub. US2004/0085691A1 disclosed. Referring to FIG. 4, the ESD protection element comprises a P-type semiconductor substrate 40 to be the collector, a N-type well 42 is buried thereon, then the heavily concentration P-type semiconductor zones 401 402 are doped on the substrate 40, which is used to- be the terminals outside. An emitter of the ESD protection element is formed with the heavily concentration P-type semiconductor zone 403 doped within the N-type well 42. According to the structure, N-type heavily doped regions 411 and 412 are formed adjacent to the N-type well 42, and further a plurality of isolated layers 44 are formed to isolate the regions 401, 411, 403, 412 and 402. The structure stated above is equivalent to a PNP bipolar junction transistor with low breakdown voltage, and is formed the protection element. When the PN or NP junction avalanches due to the ESD discharging, the ESD discharging path is provided from the emitter formed by P-type semiconductor zone 403 to the collector formed by P-type semiconductor substrate 40 instantaneously.

Moreover, the junction between P-type semiconductor zone 403 and N-type well 42 has low breakdown voltage since the zone 403 is heavily doped. Otherwise, the junction between N-type well 42 and P-type semiconductor substrate 40 has a relatively high breakdown voltage since both the substrate 40 and the N-type well are lightly doped, and where the junction is not easily broken through by ESD current.

In view of the structure of the arts aforementioned has the capability of preventing the damage from ESD event, the present invention further provides an ESD protection device by electrically coupling diode and PNP transistor in parallel, and the strength of protection will be enhanced substantially, especially in human body mode. Specifically, the high-voltage ESD protection the present invention can meet is at least more than 4 KV.

SUMMARY OF THE INVENTION

Electrostatic discharge (ESD) protection device in high voltage and the manufacturing method is disclosed. The ESD protection device is installed between a ground terminal and an input terminal connected with an inner circuit to be protected. The ESD protection device for high voltage comprises at least one PNP transistor and at least one diode electrically coupled in parallel, and provides an ESD discharging path during the ESD event. The device comprises a substrate, at least one PNP transistor electrically coupled an input terminal connected with the inner circuit and a ground terminal, and at least one diode electrically coupled the input terminal and the ground terminal. Further, the diode has a Salicide block disposed inside to prevent the salicide formation within the diode region, and connects with the PNP transistor in parallel.

The method for manufacturing an ESD protection device of the present invention comprises the following steps. In the beginning, a P-type semiconductor substrate is provided. The P-type ions are implanted into the P-type semiconductor substrate, and being diffused to form at least one lightly doped P-type well. Next, the N-type ions are implanted to the P-type semiconductor substrate, and being diffused to form at least one lightly doped N-type well adjacent to the P-type well. At least one P-type semiconductor zone is formed by doping heavily concentration P-type semiconductor material P+ to the N-type well and the P-type well on a first region of the P-type semiconductor substrate. A conducting terminal coupled with the input of the ESD protection device is formed by doping heavily concentration N-type semiconductor material N+ to the N-type well on a second region of the P-type semiconductor substrate. Finally, another conducting terminal coupled with the ground of the ESD protection device is formed by doping heavily concentration P-type semiconductor material P+ to the P-type well on a second region of the P-type semiconductor substrate. The combination of the PNP transistors and the diodes are employed to provide an ESD path to protect the inner circuit operating in the high voltage from electro-static discharge (ESD).

BRIEF DESCRIPTION OF THE DRAWINGS

The present invention will be readily understood by the following detailed description in conjunction accompanying drawings, in which:

FIG. 6A is a schematic diagram of the ESD protection circuit of the second embodiment;

DETAILED DESCRIPTION OF THE PREFERRED EMBODIMENTS

To allow the Examiner to understand the technology, means and functions adopted in the present invention, reference is made to the following detailed description and attached drawings. The Examiner shall readily understand the invention deeply and concretely from the purpose, characteristics and specification of the present invention. Nevertheless, the present invention is not limited to the attached drawings and embodiments in following description.

The present invention illustrates an electrostatic discharge (ESD) protection device in high voltage and manufacturing method for the same. It relates to the ESD protection device with installation of at least one PNP transistor and at least one diode to protect an inner circuit receiving a high voltage, which is higher than 5 V. The invention provides an ESD discharging path during the ESD event.

Figure 1:
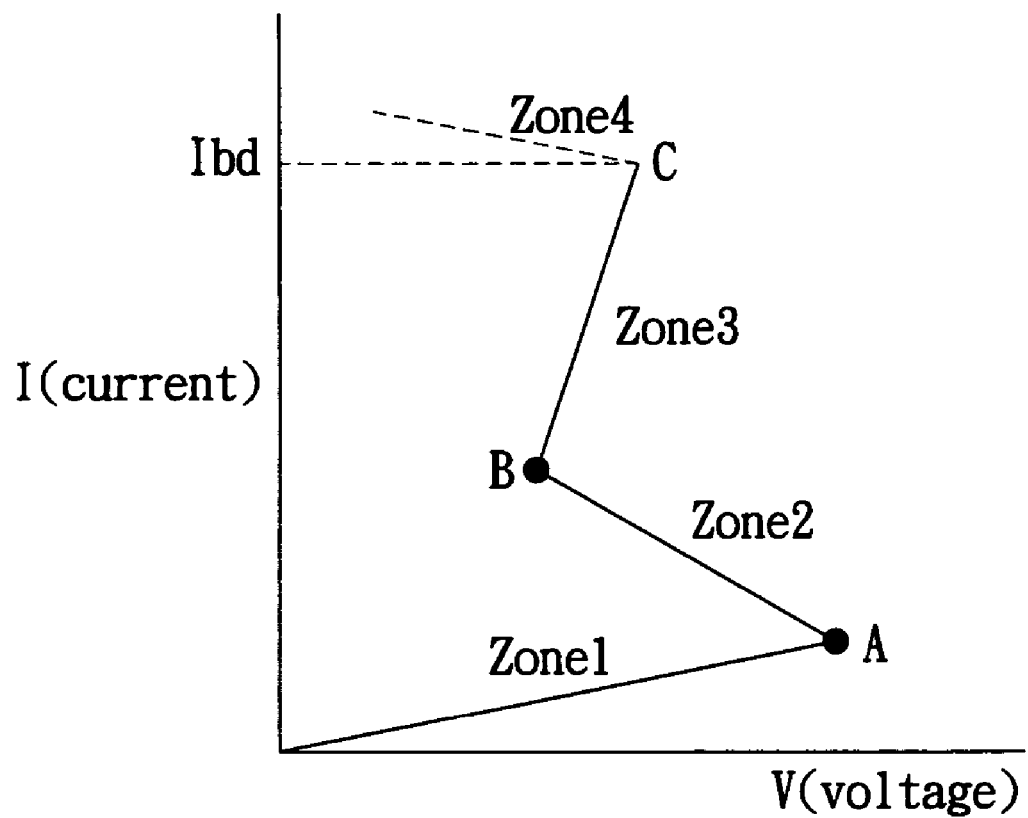
FIG. 1 is a voltage-current characteristic diagram of the ESD protection circuit of the prior art.
Figure 2:
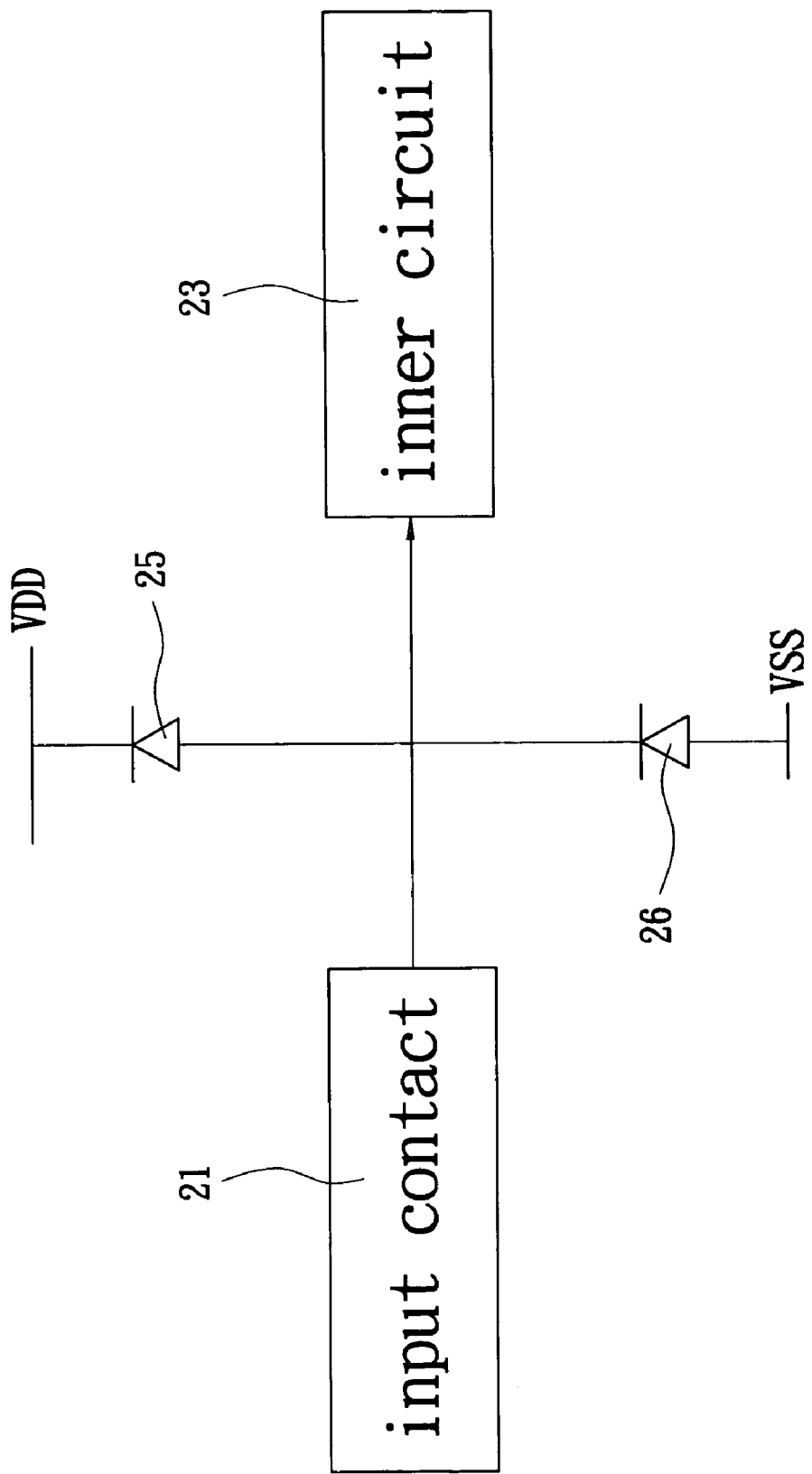
FIG. 2 is a schematic diagram of the ESD protection circuit with diode of the prior art.
Figure 3:
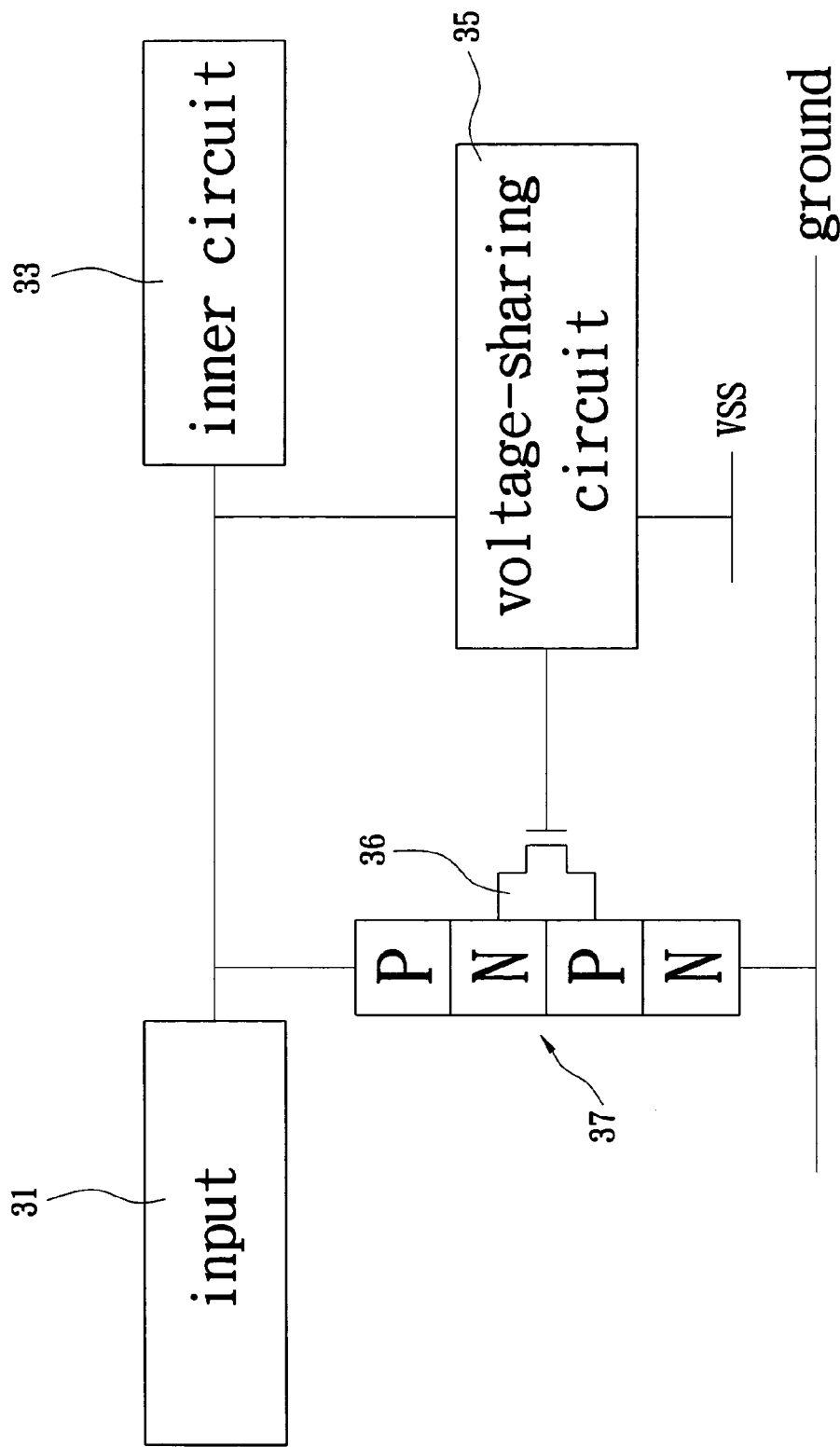
FIG. 3 is a schematic diagram of the ESD protection circuit with SCR elements and the voltage-sharing circuit of the prior art.
Figure 4:
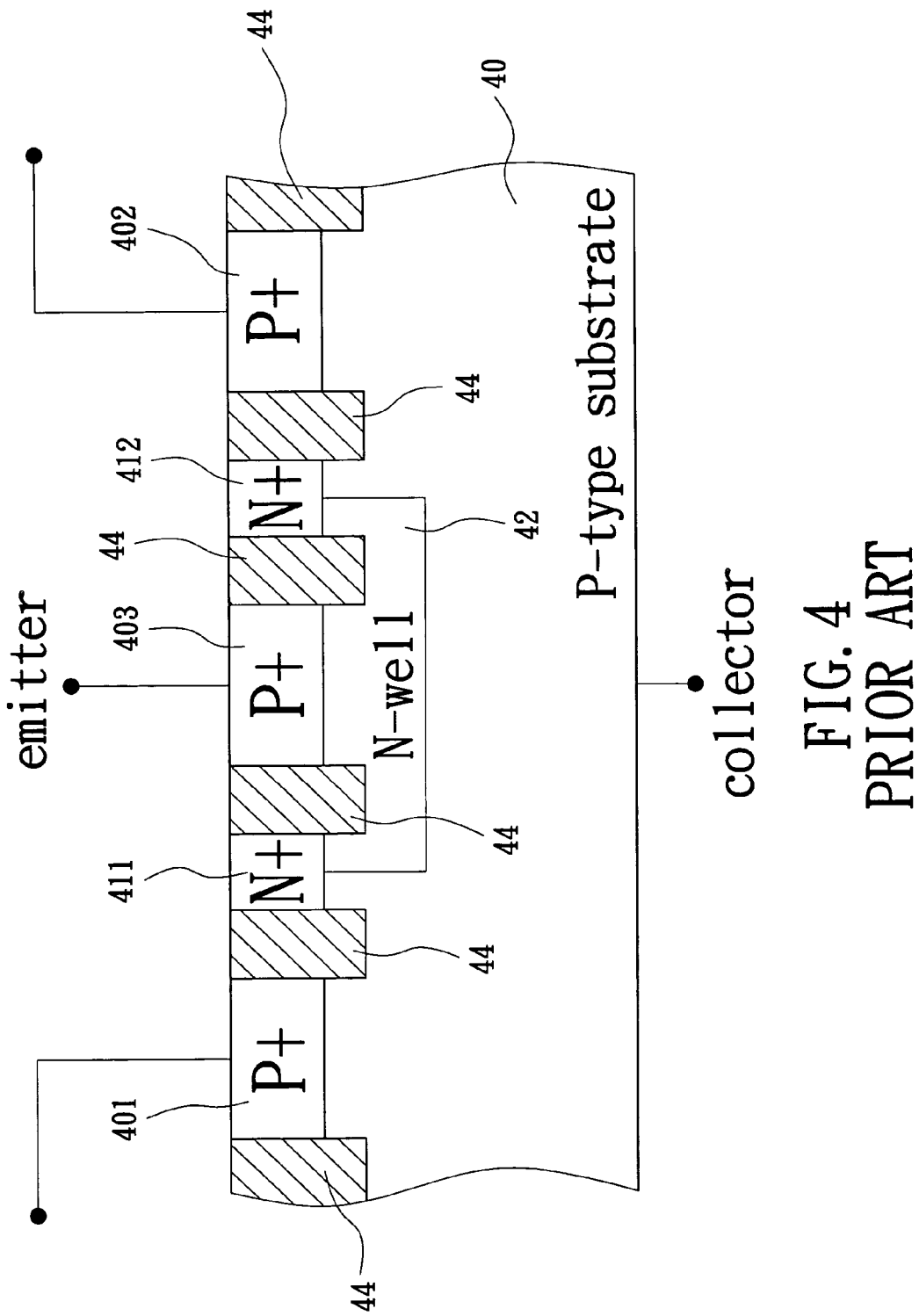
FIG. 4 is a schematic diagram of the ESD protection circuit with PNP transistor of the prior art.
Figure 5:
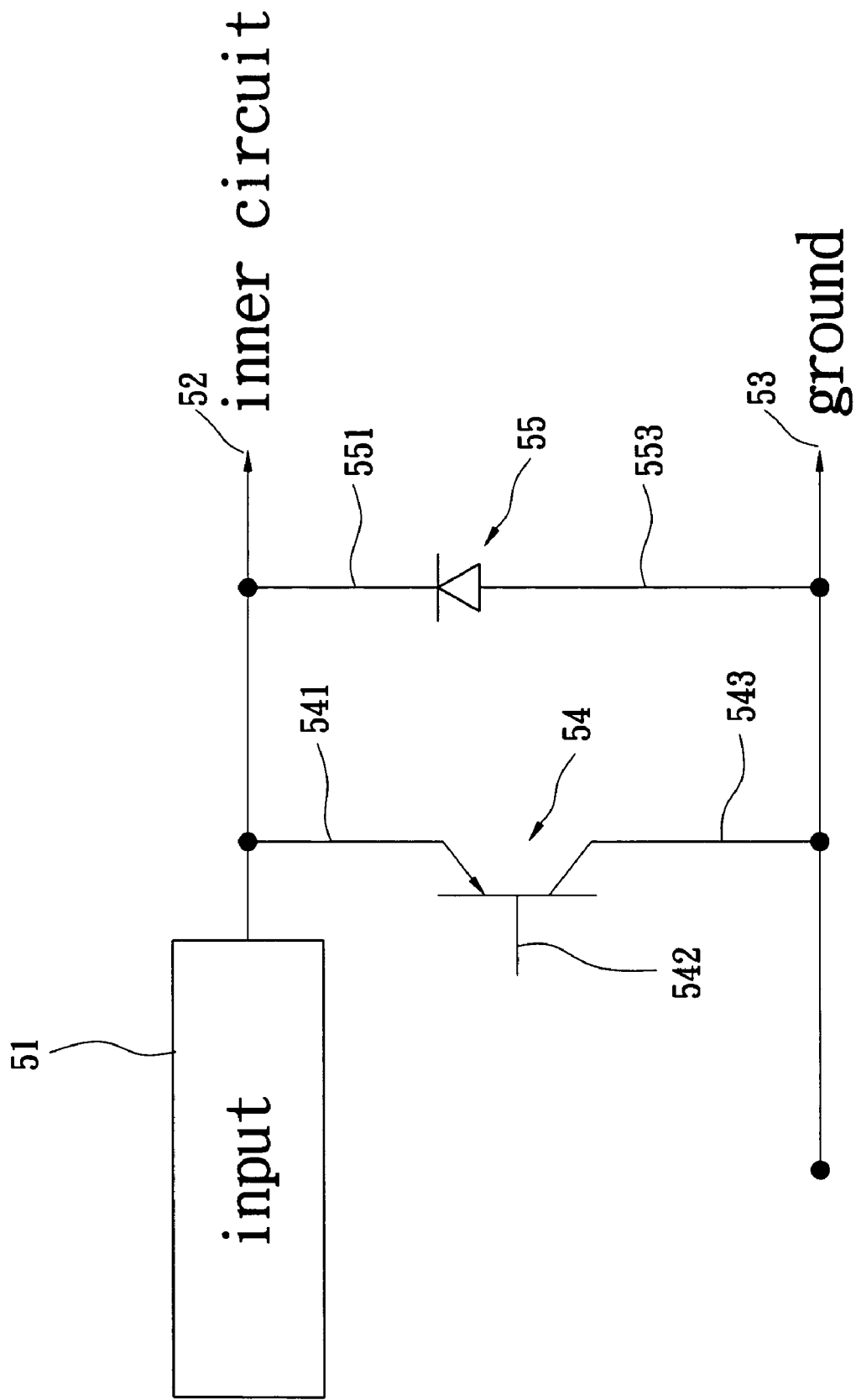
FIG. 5 is a schematic diagram of the ESD protection circuit of the first embodiment.

Reference is made to FIG. 5 showing a first embodiment of the present invention. For protecting the inner circuit 52, the embodiment provides a protection device comprising a PNP transistor 54 and a diode 55 electrically coupled in parallel. As the PNP transistor 54 shown in the diagram, an input terminal 541 (i.e. emitter of the transistor) and a ground terminal 543 (i.e. collector of the transistor) of the transistor 54 respectively couple with the input 51 and the ground 53. As the diode 55 shown in FIG. 5, a N terminal 551 and a P terminal 553 of the diode 55 respectively couple with the input. 51 and the ground 53. In the first embodiment, the input 51 is electrically coupled with the inner circuit 52, wherein a Salicide block is disposed to prevent the region of diode 55 from salicide formation. As the ESD event occurs, the aforementioned device provides an ESD discharging path from the input 51 to the ground 53, and being used to protect the inner circuit 52 from the high voltage discharging. The PNP transistor 54 is composed of adjacent heavily doped P-type semiconductor zone (P+), lightly doped N-type semiconductor zone (N−), and the P-type semiconductor substrate (P-sub). The heavily doped P-type semiconductor zone (P+) forms the input terminal 541 of the PNP transistor 54, namely the emitter electrode of the transistor, which couples with the input 51 and the inner circuit 52. The lightly doped N-type semiconductor zone (N−) forms a N-type well, which is a control terminal 542, namely the base electrode, of the PNP transistor 54. The P-type semiconductor substrate forms the ground terminal 543, namely the collector electrode; of the PNP transistor 54, which couples with the ground 53.

Figure 6B:
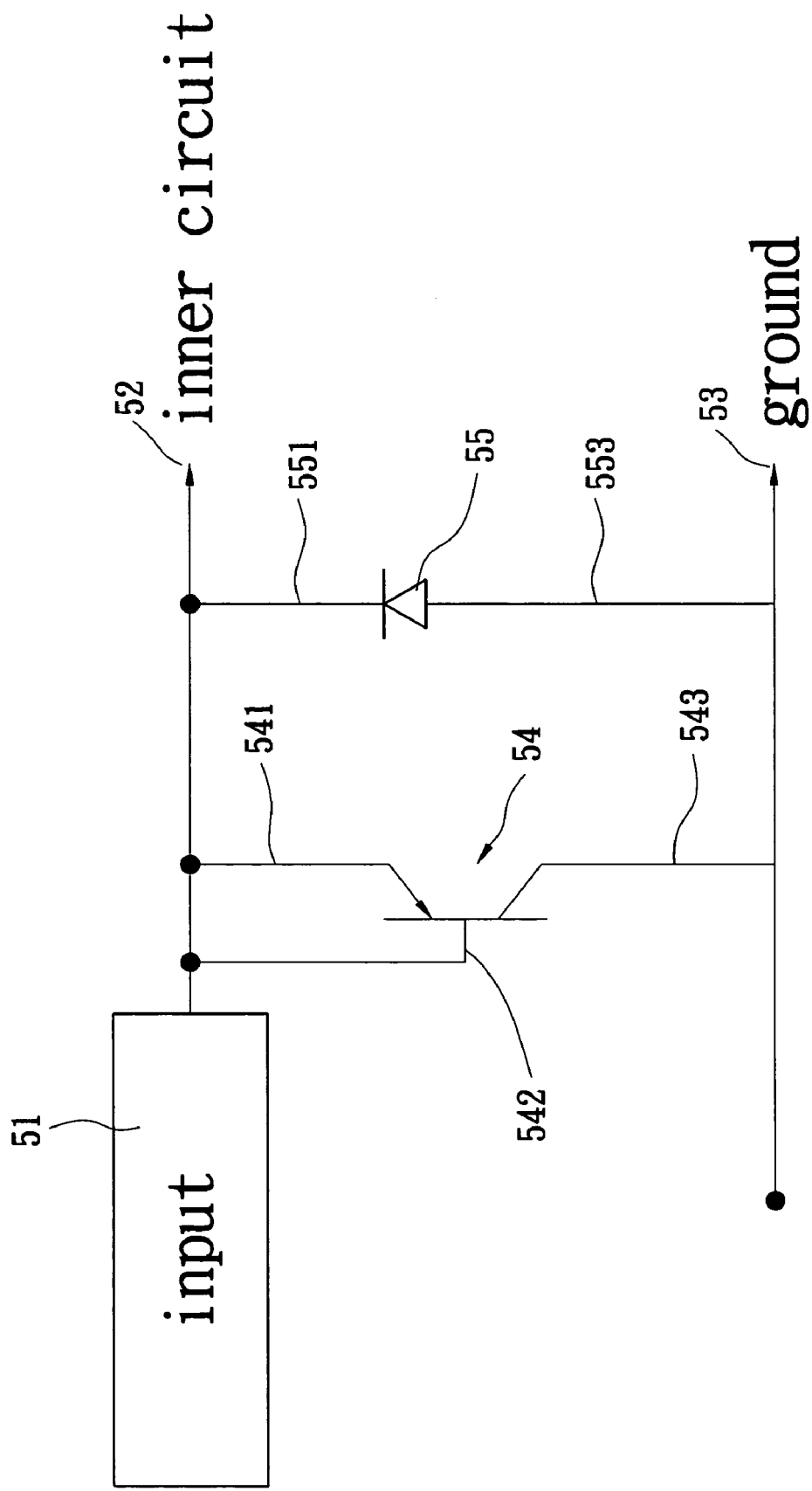
FIG. 6B is a schematic diagram of the ESD protection circuit of the third embodiment.

Particularly, the control terminal 542 of the PNP transistor 54 can be floating as the first embodiment shown in FIG. 5, and coupled with the ground 53 as the second embodiment shown in FIG. 6A, and coupled with the input 51 as the third embodiment shown in FIG. 6B.

As the first embodiment illustrated in FIG. 5, the diode 55 is formed with adjacent N-type well and P-type well. The N-type well within is the lightly doped N-type semiconductor zone (N−) having an N terminal 551 of the diode coupled with input 51. The P-type well nearby is the lightly doped P-type semiconductor zone (P−) having a P terminal 553 of the diode coupled with ground 53.

More particularly, the area of the diode is larger than the area of the PNP transistor is the preferred embodiment of the present invention.

The result of the experiment data listed in table 1 shows the ESD protection device of the present can reach the purpose of high-voltage ESD protection, however, the data is not limitation or any constraint of the present invention.

TABLE 1

| type of ESD protection device | Human body mode (HBM) | machine mode (MM) |
|---|---|---|
| Diode only | 3000 | 200 |
| PNP transistor only | 2000 | 200 |
| PNP transistor electrically coupled with Diode in parallel | 4500 | 300 |

Figure 6C:
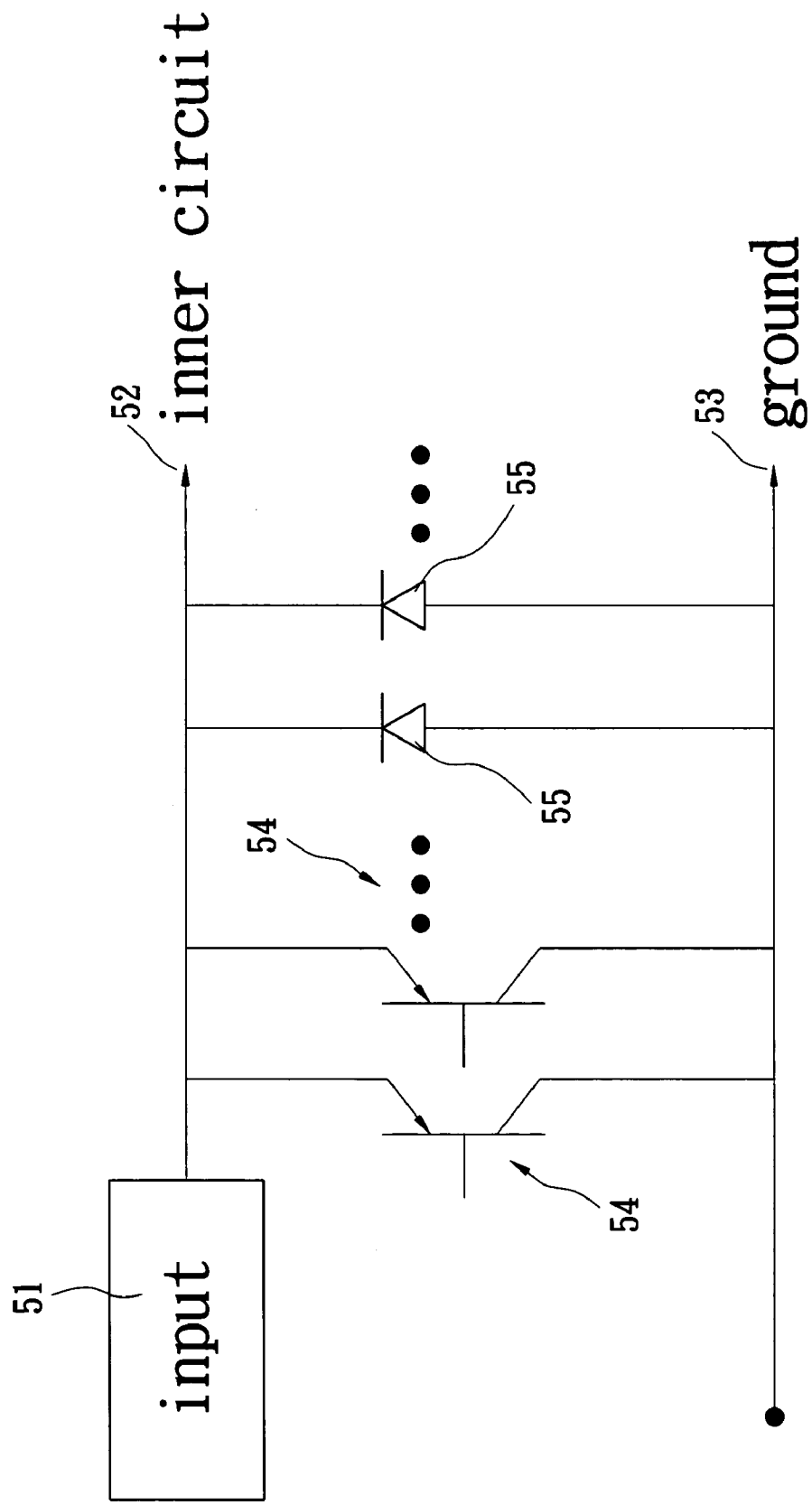
FIG. 6C is a schematic diagram of the ESD protection circuit of the fourth embodiment.

FIG. 6C shows the fourth embodiment of the present invention, which illustrates a plurality of PNP transistors 54 and a plurality of diodes 55 electrically coupled with each other in parallel. Whereby the ESD protection device can enhance the capability of high voltage ESD protection further.

Figure 7:
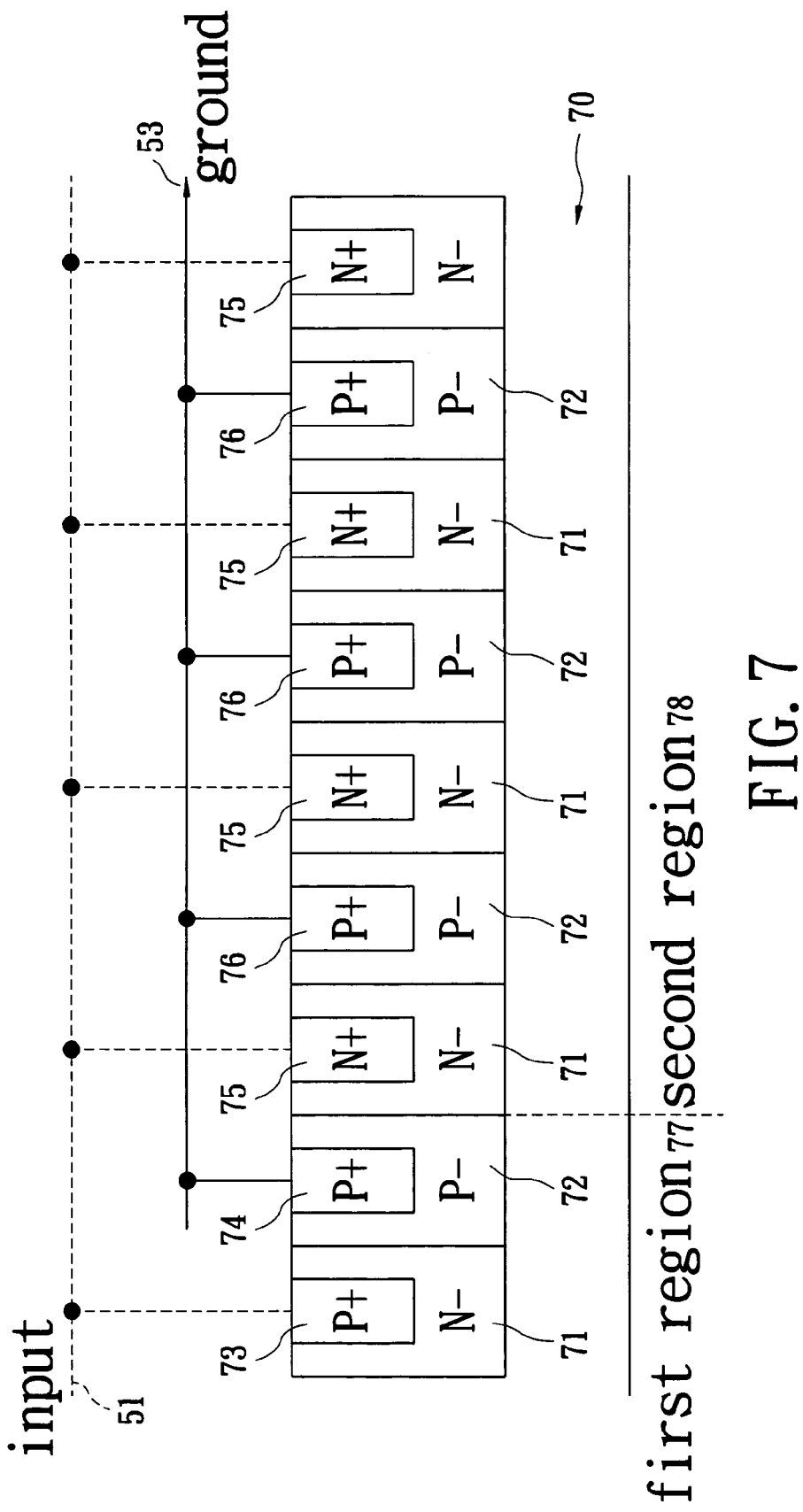
FIG. 7 illustrates a cross-sectional diagram of the ESD protection circuit of the present invention.

FIG. 7 shows the cross-sectional diagram of the present invention. A plurality of lightly doped N-type semiconductor zones (N−) 71 and lightly doped P-type semiconductor zone (P−) 72 are doped on the P-type substrate 70 contiguously. By far, the N− zone 71 has formed N-type well, and P− zone 72 has formed P-type well. After that, the device is separated into a first region 77 and a second region 78 according the following implementation.

In the first region 77 as shown in FIG. 7, a heavily concentration P-type semiconductor material is doped on one of the N− zone 71 to form a first P+ zone 73, and a heavily concentration P-type semiconductor material is doped on one of the P− zone 72 next to the aforementioned N− zone 71 to form a second P+ zone 74. So the first region 77 has formed the PNP transistor, which includes the first P+ zone 73, the second P+ zone 74, and the relevant N− zone 71 and P− zone 72 formed on the P-type substrate 70, wherein the first P+ zone 73 is the emitter electrode, the N− zone 71 is the base electrode and the P-type substrate 70 is the collector electrode of the PNP transistor, respectively. The second P+ zone 74, and the relevant P− zone 72 are the pickup of the P-type substrate, 70 for reducing the contact resistance. The first P+ zone 73 couples with the input 51, and the P-type substrate 70 couples with the ground 53 through the P− zone 72 and the second P+ zone 74.

Figure 8:
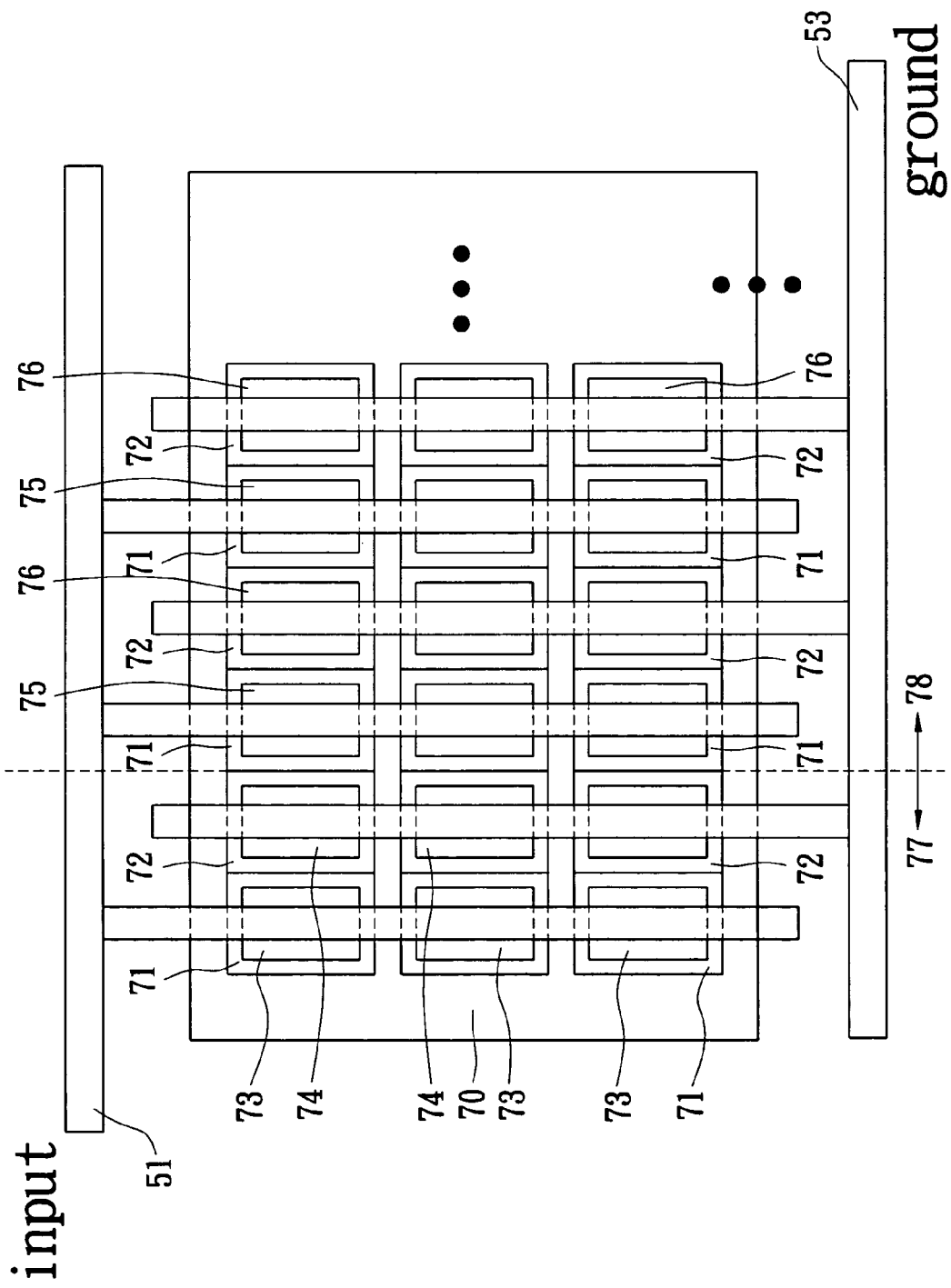
FIG. 8 illustrates a layout diagram of the ESD protection circuit of the present invention.

The second region 78 includes the other N− zone 71 and P− zone 72 doped on the P-type substrate 70 contiguously, and N+ zone 75, P+ zone 76 doped within each N− zone 71 and P− zone 72 respectively. Wherein the heavily concentration N-type semiconductor material is doped on the N− zone 71 to form the N+ zone 75, and the heavily concentration P-type semiconductor material is doped on the P− zone 72 to form the P+ zone 76 in the second region 78 respectively for reducing the contact resistance. The adjacent N− zone 71 and P− zone 72 in the second region 78 is to form the diode of the present invention. For enhancing the capability of ESD protection, the diode with adjacent N-type well and P-type well should be blocked to prevent from the salicide formation. In the second region 78, the N− zone 71 is electrically coupled to the input 51 through N+ zone 75, and the P− zone 72 is electrically coupled to the ground 53 through the P+ zone 76. FIG. 8 shows the layout diagram of a preferred embodiment of the present invention. The ESD device shown in diagram is a vertical structure between the input 51 and the ground 53. A plurality of contiguous and adjacent N− zones 71 and P− zones 72 are formed with doping the lightly concentration N-type and P-type semiconductor material on the P-type substrate respectively, namely, the N− zones 71 form the N-type wells, and P− zones 72 form the P-type well. The ESD device is separated into the first region 77 and the second region 78.

In FIG. 8, a plurality first P+ zones 73 are formed with the heavily concentration P-type semiconductor material doped on the N− zones 71 in the first region 77, and connect with the input 51. A plurality of second P+ zones 74 are formed with the heavily concentration P-type semiconductor material doped on the P− zones 72 in the second region 78, and connect with the ground 53.

Moreover, a plurality N+ zones 75 are formed in second region 78 with the heavily concentration N-type semiconductor material doped on the N− zones 71 (N-type well). A plurality of P+ zones 76 in the second region 78 are formed with the heavily concentration P-type semiconductor material doped on the P− zones 72 (P-type well). As shown in FIG. 8, the N+ zones 75 in vertical direction connect with the input 5 1, and the P+ zones 76 in the vertical direction connect with the ground 53.

Figure 9:
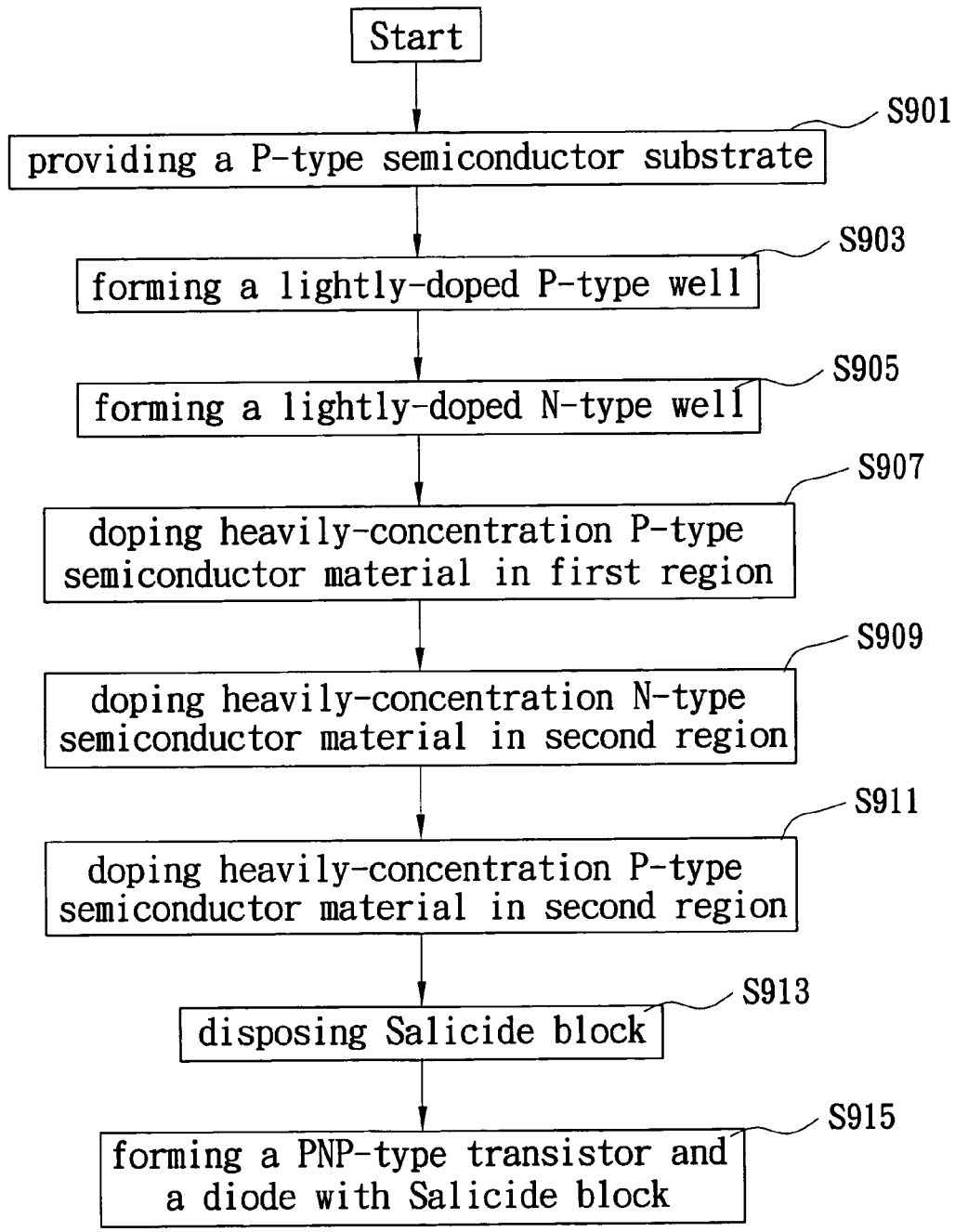
FIG. 9 is a flow chart of the manufacturing method of the present invention.

Reference is made to FIG. 9 showing the flow chart of the manufacturing method of the present invention. The method for manufacturing an ESD protection device including at least one PNP transistor and at least one diode are coupled between the ground and the input of the device, comprising the steps:

First, a P-type semiconductor substrate (P-sub) is provided. (step S901)

In step S903, a lightly doped P-type well is formed. In the preferred embodiment, P-type ions are implanted to the P-type semiconductor substrate, and diffused to form at least one lightly doped P-type well.

Next, the neighboring lightly doped N-type well is formed adjacent to the P-type well as well. Where N-type ions are implanted to the P-type semiconductor substrate and diffused to form at least one lightly doped. (step S905)

The aforementioned N-type well and P-type well are formed NPNP structure above the P-type substrate contiguously.

The whole ESD device is separated- into the first region and the second region as required. One or a plurality of heavily doped P-type semiconductor zones (P+ zone) in the first region are formed on the N-type well and P-type well of the first region by doping the heavily concentration P-type semiconductor material (P+ zone in first region). (step S907)

One or a plurality of heavily doped N-type semiconductor zones (N+ zone) coupled with the input are formed on the N-type well of-the second region by doping the heavily concentration N-type semiconductor material (N+ zone in second region). (step S909)

Meantime, in the step S911, one or a plurality of heavily doped P-type semiconductor zones (P+ zone) coupled with the ground are formed on the P-type well of the second region by doping the heavily concentration P-type semiconductor material (P+ zone in second region).

As illustrated above, the N-type well in second region having an N terminal of the diode coupled with the input of the ESD protection device. The P-type well nearby having a P terminal of the diode coupled with the ground of the device.

After forming the N+ zone and the P+ zone on the second region, one or a plurality of the Salicide blocks (SAB) are disposed over the regions among the N-type well and the P-type well contiguously. (step S913)

The structure in the first region is the PNP transistor, and diode with Salicide block is formed in the second region as well. (step S915)

Where the PNP transistor is composed of the P-type semiconductor zone, the N-type well and P-type semiconductor substrate in the first region, and the diode is composed of the P-type well and the N-type well of the adjacent second region. Particularly, the base electrode of the PNP transistor is floating, or couples with the ground, or couples with the input. The emitter electrode and collector electrode of the transistor couple with the input and the ground respectively, and the diode bridges the input and the ground using the two terminals thereof.

Finally, the combination of the PNP transistors and the diodes is employed to provide an ESD path to protect the inner circuit from high voltage electro static discharge (ESD).

The invention may be embodied in other specific forms without departing from the sprit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A method for manufacturing an ESD protection device, at least one PNP transistor and at least one diode are coupled between a ground and an input, the method comprising:
   providing a P-type semiconductor substrate;
   implanting P-type ions to the P-type semiconductor substrate, and diffusing to form a plurality of lightly doped P-type wells;
   implanting N-type ions to the P-type semiconductor substrate, and diffusing to form a plurality of lightly doped N-type wells adjacent to the lightly doped P-type well;
   in a first region of the P-type semiconductor substrate, doping heavily concentration P-type semiconductor material P+ into the lightly doped N-type well to form a first conducting terminal and the lightly doped P-type well to form a second conducting terminal, wherein the first conducting terminal couples with the input and the second conducting terminal couples with the ground;
   in a second region of the P-type semiconductor substrate, doping heavily concentration N-type semiconductor material N+ into the lightly doped N-type well to form a third conducting terminal coupled with the input; and
   in the second region of the P-type semiconductor substrate, doping heavily concentration P-type semiconductor material P+ into the lightly doped P-type well to form a forth conducting terminal coupled with the ground;
   wherein, in the first region, the PNP transistor is composed of the first conducting terminal, the lightly doped N-type well and the lightly doped P-type well, and the PNP transistor couples to the input through the first conducting terminal and couples to the ground through the second conducting terminal; and
   wherein, in the second region, the diode is composed of the lightly doped P-type well and the lightly doped N-type well, and the diode couples to the input through the third conducting terminal and couples to the ground through the fourth conducting terminal.

2. The method as recited in claim 1, wherein the P-type substrate is formed by a lightly concentration P-type semiconductor material.

3. The method as recited in claim 1, wherein the lightly doped N-type well is a lightly doped N-type semiconductor region.

4. The method as recited in claim 1, wherein the lightly doped P-type well is a lightly doped P-type semiconductor region.

5. The method as recited in claim 1, wherein at least one Salicide block is disposed to cover the lightly doped P-type well and the adjacent lightly doped N-type well.

6. The method as recited in claim 1, wherein the first conducting terminal is an input terminal of the PNP transistor.

7. The method as recited in claim 1, wherein the P-type semiconductor substrate is a ground terminal of the PNP transistor.

8. The method as recited in claim 1, wherein the lightly doped N-type well in the first region is a control terminal of the PNP transistor.

9. The method as recited in claim 8, wherein the control terminal of the PNP transistor is floating.

10. The method as recited in claim 1, wherein the third conducting terminal is an N terminal of the diode.

11. The method as recited in claim 1, wherein the forth conducting terminal is a P terminal of the diode.

12. The method as recited in claim 1, wherein the size of the diode is larger than the size of the PNP transistor.

13. A method for manufacturing an ESD protection device comprising a transistor and a diode, the method comprising:
    providing a semiconductor substrate having a first conductivity type;
    forming a plurality of lightly doped first wells, having the first conductivity type, in a first region and a second region of the semiconductor substrate;
    forming a plurality of lightly doped second wells, having a second conductivity type, in the first region and the second region of the semiconductor substrate;
    doping heavily concentration impurity, having the first conductivity type, into the plurality of lightly doped first wells to form first terminals and into the lightly doped second well in the first region of the semiconductor substrate to form a second terminal;
    doping heavily concentration impurity, having the second conductivity type, into the lightly doped second well in the second region of the semiconductor substrate to form a third terminal;
    coupling the first terminals to a ground; and
    coupling the second terminal and the third terminal to an input;
    wherein, in the first region, the second terminal, the lightly doped first well and the lightly doped second well are arranged to act as the transistor, and the transistor couples to the input through the second terminal and couples to the ground through the first terminal; and
    wherein, in the second region, the lightly doped first well and the lightly doped second well are arranged to act as the diode, and the diode is coupled to the input through the third terminal and the ground through the first terminal.

14. The method as recited in claim 13, wherein the semiconductor substrate is formed by a lightly concentration P-type semiconductor material.

15. The method as recited in claim 13, wherein the lightly doped second well is a lightly doped N-type semiconductor region.

16. The method as recited in claim 13, wherein the lightly doped first well is a lightly doped P-type semiconductor region.

17. The method as recited in claim 13, wherein at least one Salicide block is disposed to cover the lightly doped P-type well and the lightly doped N-type well.

* * * * *